United States Patent [19]

Law et al.

[11] Patent Number: 4,960,488
[45] Date of Patent: Oct. 2, 1990

[54] REACTOR CHAMBER SELF-CLEANING PROCESS

[75] Inventors: Kam S. Law, Union City; Cissy Leung, Fremont; Ching C. Tang, San Francisco; Kenneth S. Collins, San Jose; Mei Chang, Cupertino; Jerry Y. K. Wong, Union City; David Nin-Kou Wang, Cupertino, all of Calif.

[73] Assignee: Applied Materials, Inc., Santa Clara, Calif.

[21] Appl. No.: 455,799

[22] Filed: Dec. 19, 1989

Related U.S. Application Data

[63] Continuation of Ser. No. 67,210, Jun. 26, 1987, abandoned, which is a continuation-in-part of Ser. No. 944,492, Dec. 19, 1986, Pat. No.

[51] Int. Cl.$^5$ .......................... B08B 7/00; C23F 1/12; H01L 21/306
[52] U.S. Cl. ..................... 156/643; 156/345; 134/1; 204/298.31; 204/298.33
[58] Field of Search ............... 156/643, 646, 652, 345; 134/1; 437/228, 238, 243; 204/298.31, 298.33

[56] References Cited

U.S. PATENT DOCUMENTS

| 4,529,474 | 7/1985 | Fujiyama et al. | 156/643 |
| 4,534,816 | 8/1985 | Chen et al. | 156/345 |
| 4,657,616 | 4/1987 | Benzing et al. | 156/345 |

Primary Examiner—David L. Lacey
Assistant Examiner—Todd J. Burns
Attorney, Agent, or Firm—Philip A. Dalton

[57] ABSTRACT

A process for cleaning a reactor chamber both locally adjacent the RF electrodes and also throughout the chamber and the exhaust system to the including components such as the throttle valve. Preferably, a two-step continuous etch sequence is used in which the first step uses relatively high pressure, close electrode spacing and fluorocarbon gas chemistry for etching the electrodes locally and the second step uses relatively lower pressure, farther electrode spacing and fluorinated gas chemistry for etching throughout the chamber and exhaust system. The local and extended etch steps may be used separately as well as together.

16 Claims, 3 Drawing Sheets

REACTOR CHAMBER SELF-CLEANING PROCESS

This is a continuation of application Ser. No. 067,210, filed 6/26/87, now abandoned, which is a continuation-in-part of copending patent application Ser. No. 944,492, filed Dec. 19, 1986.

BACKGROUND OF THE INVENTION

The present invention relates to a reactor and methods for performing single and in-situ multiple integrated circuit processing steps, including thermal CVD, plasma-enhanced chemical vapor deposition (PECVD), and film etchback. The present invention also relates to processes for forming conformal, planar dielectric layers on integrated circuit wafers. In particular, the present invention also relates to dry process sequences for self-cleaning the reactor in-situ without dis-assembling the reactor or using time-consuming, potentially hazardous wet chemical cleaning.

The reactor described herein and in the parent Wang et al application is adapted for processing very small geometry devices which are very susceptible to even small amounts of very small particulates. Although this reactor operates at relatively higher pressure than conventional reactors, it creates long-lived species which may still deposit in the exhaust system and in downstream exhaust system components to the throttle valve. Thus, although the operation of the present reactor is cleaner than conventional reactors and although cleaning can be done less frequently, it is very desirable to be able to clean the reactor chamber and the vacuum system to prevent contamination of particulate-sensitive small geometry devices and to ensure long-term operation of components such as the throttle valve.

OBJECTS

It is an object of the present invention to provide a versatile single wafer semiconductor processing reactor and an associated multiplicity of processes including thermal chemical vapor deposition, plasma-enhanced chemical vapor deposition and plasma-assisted etchback, which can be performed alone and in-situ in a multiple process sequence.

It is a related object to provide a plasma reactor self-cleaning process technology which is applied in-situ without disassembling or removing chamber components.

It is a related object to provide a process for cleaning in-situ, in a single continuous process sequence, both a reactor chamber and its exhaust system.

SUMMARY

In one aspect, the present invention relates to a self-cleaning process for locally cleaning the gas distribution manifold and electrodes of an RF powered reactor chamber comprising communicating into the chamber via the gas manifold a fluorocarbon gas alone or doped with reactant gas such as oxygen while applying RF power to the chamber electrodes for forming an etching gas of the inlet mixture and maintaining the chamber at a pressure sufficiently high for etching deposits from the gas manifold and electrodes.

In another aspect, the present invention relates to a self-cleaning process for wide area cleaning of the chamber components and exhaust system components of an RF powered reactor chamber comprising communicating into the chamber via the gas manifold a fluorinated gas while applying RF power to the chamber electrodes for forming an etching gas of the gas and maintaining the chamber at a pressure selected for extending the etching plasma throughout the chamber and into the exhaust system.

In still another aspect, the present invention relates to the use of the above local and extended area cleaning steps in combination to provide local and extended cleaning of the chamber and exhaust.

The invention also encompasses a method of using an RF powered reactor chamber having a gas inlet manifold and a vacuum outlet system, employing self-cleaning, comprising: first, depositing at least a silicon oxide layer on a substrate positioned within the chamber; and secondly, applying the above local cleaning step. Furthermore, one or several cycles of this deposition and local clean sequences may be used before both the local clean and extended cleaning sequences are used following deposition to thoroughly clean the entire reactor and exhaust.

BRIEF DESCRIPTION OF THE DRAWINGS

The above and other aspects and advantages of the present invention are described in conjunction with the following drawing figures, in which.

DETAILED DESCRIPTION OF THE INVENTION

I. CVD/PECVD Self-Cleaning Reactor

A. Overview of CVD/PECVD Reactor

The description of reactor 10 is included here to facilitate understanding of the present reactor self-cleaning process in its preferred application. However, the oxide deposition and etch processes described here are applicable to other reactors and can be understood by referring to Sections II and III alone, i.e., without Section I.

Figure 1:
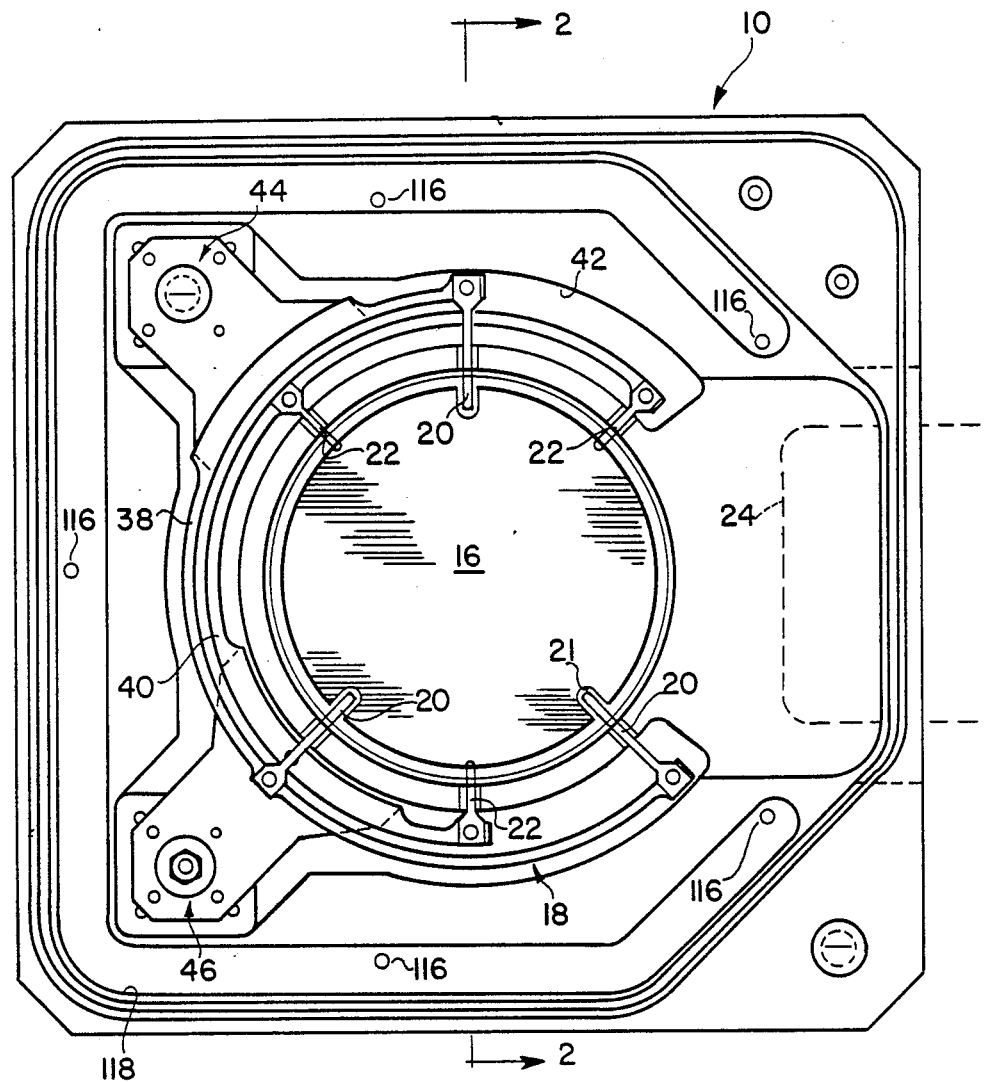
FIG. 1 is a top plan view of a preferred embodiment of the combined CVD/PECVD reactor used in practicing the present invention, shown with the cover open.
Figure 2:
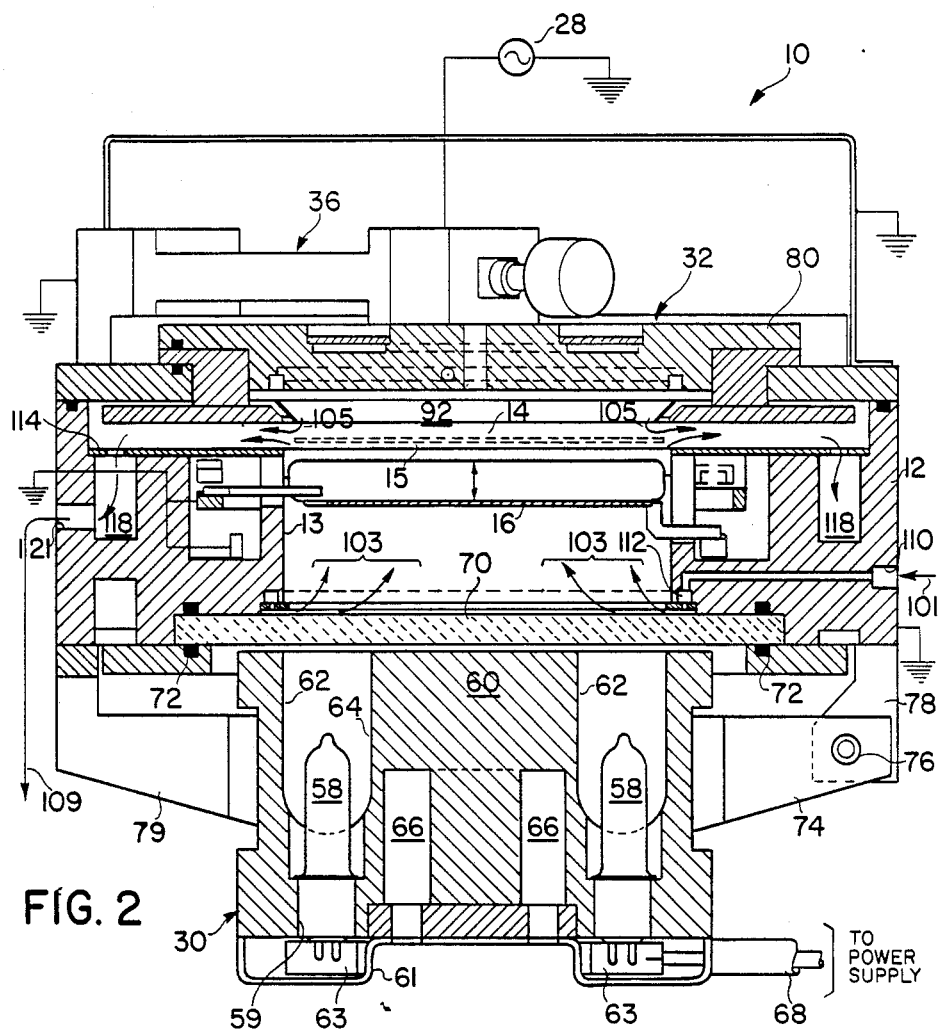
FIG. 2 is a vertical cross-section, partly in schematic, taken along line 2—2 in FIG. 1, with the cover closed.

FIGS. 1 and 2 are, respectively, a top plan view of a single wafer, reactor 10 which is the presently preferred reactor for practicing the present invention, shown with the cover pivoted open, and a vertical cross-section of the reactor 10.

Referring primarily to these two figures, the reactor system 10 comprises a housing 12 (also termed a "chamber"), typically made of aluminum, which defines an inner vacuum chamber 13 that has a plasma processing region 14. The reactor system 10 also includes a wafer-holding susceptor 16 and a unique wafer transport system 18 (FIG. 1) that includes vertically movable wafer support fingers 20 and susceptor support fingers 22. As described in the referenced Wang et al parent application, and in co-pending, commonly assigned U.S. patent application Ser. No. 944,803 now abandoned, entitled "Multiple Chamber Integrated Process System", filed concurrently in the name of Dan Maydan, et al, which Maydan et al application is hereby incorporated by reference in its entirety, these fingers cooperate with an external robotic blade 24 (FIG. 1) for introducing wafers 15 into the process region or chamber 14 and depositing the wafers 15 on the susceptor 16 for processing, then removing the wafers 15 from the susceptor 16 and the chamber 12. The reactor system 10 further comprises a process/purge gas manifold or "box" 26 that applies process gas and purging gas to the chamber 13, an RF power supply and matching network 28 for creating and sustaining a process gas plasma from the inlet gas and a lamp heating system 30 for heating the susceptor 16 and wafer 15 positioned on the susceptor to effect deposition onto the wafer. The lamp heating system is described in detail in the referenced Wang et al patent application. Preferably, high frequency RF power of 13.56 MHz is used, but low frequencies can be used.

The gas manifold 26 is part of a unique process and purge gas distribution system 32 (FIGS. 2 and 3) that is designed to flow the process gas evenly radially outwardly across the wafer 15 to promote even deposition across the wafer and to purge the spent gas and entrained products radially outwardly from the edge of the wafer 15 at both the top and bottom thereof to substantially eliminate deposition on (and within) the gas manifold or box 26 and the chamber 12. The gas manifold is described in detail in the referenced Wang et al parent patent application.

A liquid cooling system 34 controls the temperature of the components of the chamber 12 including, in particular, the temperature of the gas manifold or box 26. The temperature of the gas box components is selected to eliminate premature deposition within the gas box/manifold 26 upstream from the process chamber 14.

The reactor system 10 includes a unique, RF/gas feed-through device 36 (FIG. 2) that supplies process and purge gas to the RF-driven gas manifold 26 from an electrically ground supply. Applying the RF energy to the gas box or manifold 26 has the advantage of the wafer residing on the grounded counter electrode or susceptor 16, which makes possible a high degree of plasma confinement that would not be achievable if the RF energy were applied to the wafer and the gas box were grounded. Additionally, the hardware is mechanically and electrically simpler since electrical isolation between wafer/susceptor and chamber is not required (or permitted). Temperature measurement and control of the susceptor/wafer in the presence of high frequency electric and magnetic fields is greatly simplified with the susceptor 16 grounded. Also, the feed-through 36 is rigid, eliminating flexible gas connections and the purge gas flow path safely carries any leaking process gas into the chamber to the chamber exhaust. The capability to apply RF power to the gas manifold is made possible (despite the inherent tendency of high potential RF operation to form a deposition plasma within the feed-through) by the unique design of the feed-through, which drops the RF potential evenly along the length of the feed-through, thus preventing a plasma discharge within. The RF/gas feed through 16 is described in detail in the referenced Wang et al parent patent application.

B. Gas Manifold 26 and Associated Distribution System

The gas distribution system 32 is structured to provide a unique combination of at least four structural features. First, the gas manifold 26 is one-half (the powered half) of an electrode pair. The powered manifold 26 provides high power. Second, the gas manifold 26 and other gas distribution surfaces are temperature controlled, which contributes to uniform deposition on the wafer 15 and prevents gas decomposition, deposition or condensation within the gas distribution system upstream from the plasma processing area 14 despite the use of reactant gases such as TEOS which condenses, e.g. at ~35° C., and also decomposes or reacts with ozone at a slightly higher temperature of, e.g., ~75° C. The external manifold temperature is controlled, e.g., to >100° C., to prevent the deposition of flaky, particulate-causing deposits. Third, the gas manifold 26 and gas distribution system 32 provide a clean, uniform deposition process. Fourth, the incorporated circumferential purging gas flow prevents deposition outside of the gas distribution area, i.e., outside the wafer on the internal chamber surfaces and gas distribution system surfaces.

Figure 3:
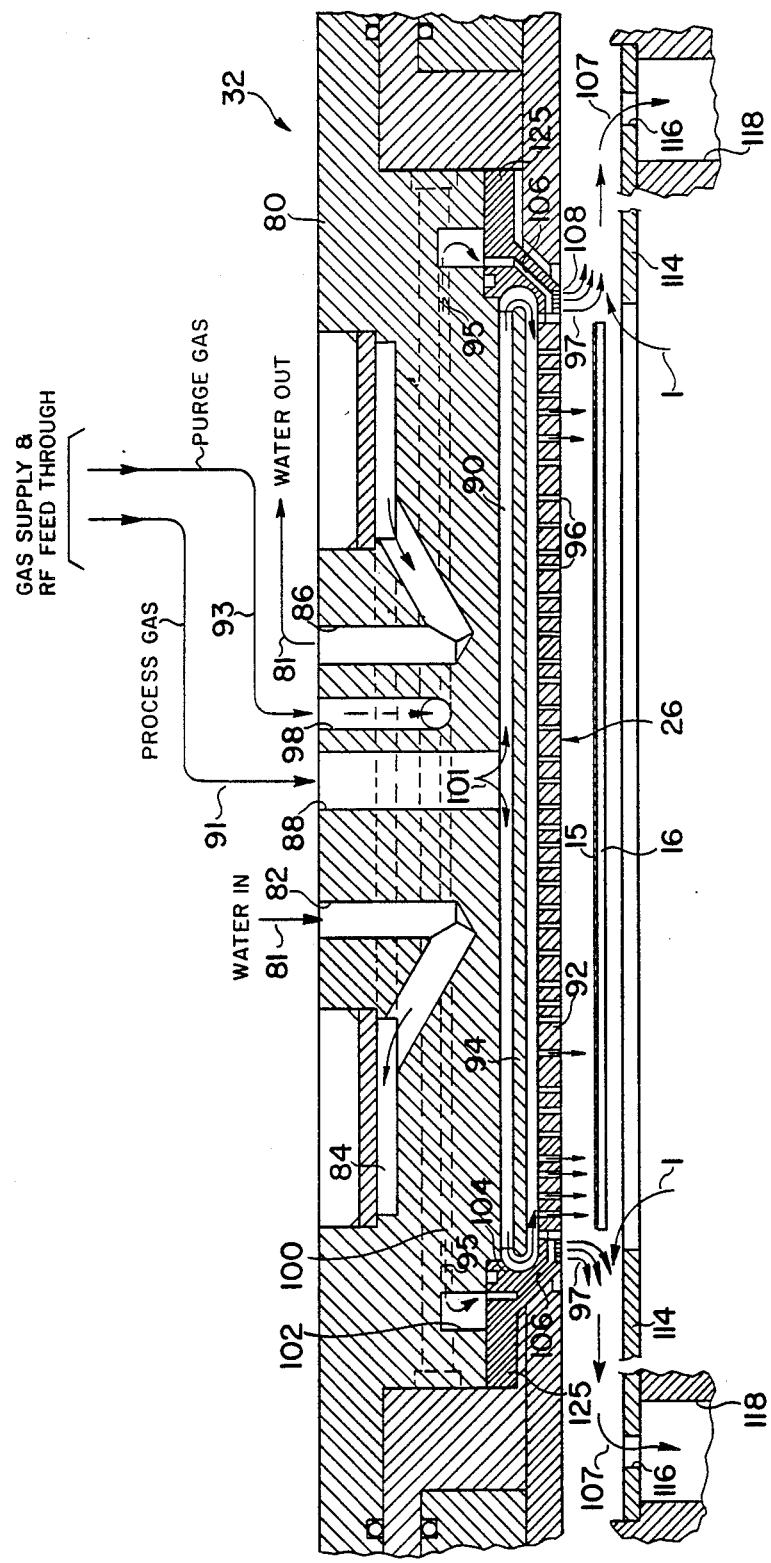
FIG. 3 is an enlarged, partial depiction of FIG. 2 showing the process gas and purge gas distribution systems in greater detail.

The above features of gas distribution system 32 are depicted most clearly in the FIG. 2 vertical section view and the FIG. 3 enlarged vertical section view. The gas manifold 26 and associated distribution system are part of the housing cover 80, which is pivotably mounted to the housing 12 by pivot means (not shown) to facilitate access to the interior of the housing, including chamber 13, plasma process chamber 14, and associated internal components of the wafer and susceptor elevator mechanisms (44,46).

The process gas flow from the feed-through 36 is directed into the cover 80 by inlet bore 88 which communicates with, that is, feeds into, gas manifold chamber 90 formed by the apertured manifold face plate 92. A uniquely designed baffle plate 94 is mounted within the gas manifold chamber 90 by means such as standoffs (not shown) to route the process gas around the outside of the edge of the baffle 94 and then radially inwardly along the bottom of the baffle and out the apertures 96—96 in the manifold plate into the plasma processing region 14 above wafer 15.

The cover 80, including the manifold 26 thereof, is heated (or cooled) by an internal flow of fluid or liquid such as de-ionized water along internal path 81 defined by inlet channel 82, annular channel 84 and outlet channel 86. Preferably, this flow keeps the face plate 92 within a narrow range, e.g, 100° C.-200° C., in order to ensure that any deposition on the face of the gas manifold which is exposed to the plasma is a hard film. A poor film formed on this surface can create particulates and this must be avoided. Also, the flow preferably holds baffle 94 within the range, most preferably within 35° C.-65° C., to prevent internal deposition or condensation of low vapor pressure process gases such as TEOS and to prevent decomposition and reactions of gases such as TEOS and ozone. Please note, such deposition is directly proportional to time, temperature (t,T). Thus, the very small gap of about 0.1 to 0.2 inches between the plates 94 and 92 also decreases any tendency to internal deposition.

As an example, in one process application involving the deposition of silicon dioxide, oxygen, TEOS and a carrier gas are inlet from manifold 26 to the chamber 14 at chamber pressure of 0.5-200 torr to form a reactant species for deposition. Wafer 15 is heated to 375° C., and hot de-ionized water (water temperature 40° C. to 65° C.) is inlet along path 81 at an adequate flow to keep plate 92 at less than 65° C. to prevent condensation of the TEOS, and to keep plate 94 greater than 100° C. (De-ionized water is used because the manifold 26 is the RF powered cathode and de-ionized water is a non-conductor.) More generally, the inlet temperature of the water is selected as required for a particular deposition process and its associated gas chemistry and/or other parameters in order to maintain both the internal surfaces and the external surfaces of the gas box 90 at desired temperatures.

To reiterate, the process gas flow is along path 91 defined through inlet bore 88, into manifold chamber 90, radially outwardly to the edge of baffle 94 and around the baffle periphery to the bottom thereof, then radially inwardly between the baffle 94 and the manifold plate 96 and out holes 96—96 into the plasma processing region 14 above the wafer 15. The flow path of the deposition gas emerging from holes 96—96 is generally radially outwardly across the wafer.

In addition, the small volume of the vacuum process chamber 14 and the high useful chamber pressure range of about 0.5 torr to near-atmospheric pressure also contribute to the tendency to provide a uniform flow radially outward from the center of the wafer 15 with uniform deposition on the wafer and purging without deposition other than on the wafer.

The manifold holes 96—96 are designed to promote this uniformity of deposition. The holes (as well as the manifold temperature, discussed above) are also designed to avoid the formation of deposits on the manifold outer (bottom) surface 97 and, in particular, to prevent the deposition of soft deposits on surface 97 which could flake off and drop onto the wafer during and after processing. Briefly, the hole array is one of generally concentric rings of holes 96—96. The distances between adjacent rings (ring-to-ring spacings) are approximately equal, and the hole-to-hole spacing within each ring is approximately equal. However, the patterns are angularly staggered so that no more than two adjacent holes (or some other selected number) are aligned radially. That is, the holes in the gas distribution plate 92 are equally spaced on circles so the hole locations do not form radial straight lines, thereby substantially decreasing deposition on the gas distribution plate itself and enabling uniform gas flow and deposition on the wafer.

In one working configuration, approximately 3400 holes 96—96 are used. The hole length is 0.100 to 0.150 in., the hole diameter is 0.028 to 0.035 in. and the radially asymmetric holes are located on approximately 0.090 in. centers. These dimensions and the associated configuration provide a uniform flow pattern and substantially decrease deposition on the manifold plate 92. The present ~6 in. manifold diameter will accommodate wafer diameters as large as ~6 in. Larger wafers can be processed by changing to a larger manifold 26, susceptor 16, larger diameter susceptor 16 and wafer support finger arrays, and by altering the lamp module 30 as described previously.

Referring further to FIG. 3, as indicated by the arrows 93, 95, 97 a first, upper purge gas flow path is provided in cover 80 and manifold 26. That is, purge gas flow from the RF/gas feed-through 36 is routed into inlet bore 98 in cover 80 (arrow 93) which feeds into radial channels or grooves 100 that in turn feed into an annular groove 102 formed in the cover concentric with and just above and outside the manifold chamber 90 (arrow 95). A ring flow turner 104 is mounted concentrically within manifold plate rim 105 and forms a peripheral channel 106 at the inside of the manifold rim that connects the annular channel 102 to the three outer rows of apertures 108 in the manifold plate 92.

Figure 4:
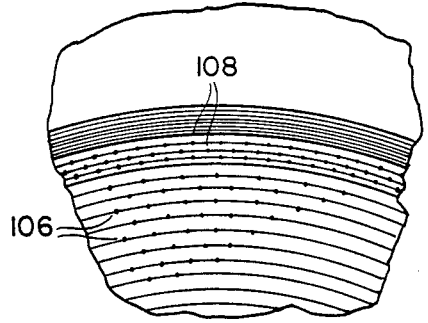
FIG. 4 is a partial, enlarged bottom plan view of the gas distribution head or manifold.

As shown in FIG. 4, the purge holes 108—108 are arranged similarly to the process gas holes 106—106 in generally concentric rings that are spaced at approximately equal ring-to-ring distances. The within-ring hole spacing is selected so that the locations of the purge holes 108—108 form staggered radial lines, i.e., so that no two adjacent purge holes are along a radial line. For the above-described exemplary manifold, the gas is distributed from about 600 holes and the following purge hole dimensions are used: between-ring spacing 0.090 in.; hole diameter 0.025 in.; and hole length 0.040 in.

Referring to FIG. 2, a second, lower purge flow path 101, 103, 105 is provided via inlet bore 110, formed in the side of the housing 12, which connects or feeds into an annular channel 112 formed generally concentrically about the lower section of the process chamber 13 just above the quartz window 70. The channel 112 has holes that are spaced about the lower region of the chamber 13 or equivalent yielding feature to feed the lower purge gas uniformly across the quartz window 70 (see arrows 103), around the lower edge of the wafer 15 (arrows 105) and across horizontal quartz cover plate 114, which surrounds the chamber 13 just below the wafer processing chamber 14. Referring also to FIG. 1, the plate 114 contains an annular pattern of holes 116 therein which are aligned with an annular gas outlet channel 118. This channel is connected via outlet bore 121 to a conventional vacuum pumping system (not shown), which establishes the vacuum within the chamber and exhausts the spent gases and entrained gas products from the chamber.

As mentioned (see FIG. 3), the upper purge gas flow is through inlet 98 (arrow 93), channels 100, 102 and 106 (arrow 95), then out purge ring apertures 108—108 (arrow 93) at the outer upper edge of the process-positioned wafer 15. Simultaneously (see FIG. 2), the lower purge gas flow is through inlet 110 (arrow 101) and annular ring 112 across the quartz window 70, sweeping the window clean (arrow 103), then upwardly toward the lower peripheral bottom edge of the wafer 15 (arrow 105). Referring to FIG. 3, the upper and lower gas purge flows 97 and 105 merge at the wafer's edge and flow outwardly as indicated by arrow 107 across the plate 114 and through the holes 116 therein into the annular exhaust channel 118 and out of the chamber along path 109 (FIG. 2). This upper and lower, merging flow pattern not only keeps the quartz window 70 clean, but also sweeps spent deposition gases, entrained particulates, etc., out of the chamber 13. The combination of the dual, upper and lower purge flows which are conformed to the inner quartz window chamber surfaces and to the circumferential wafer edge and the very high chamber pressures (unusually high for PECVD) provide a very effective purge and prevent deposition external to the wafer.

Equally important, uniform radial gas flow is provided across the wafer 15 by the multiplicity of holes 116—116, illustratively five in number, which are formed in the distributor plate 114 peripherally around the wafer 15. These holes 116 communicate into the larger semi-circular exhaust channel 118 which, in turn, is connected to the vacuum exhaust pumping system via the single outlet connection 121. The channel 118 has large conductance relative to the holes 116—116 because of its relatively very large volume, which provides uniform pumping at all points radially from the wafer, with the simplicity of a single point pump connection. In combination with the uniform gas flow distribution inlet pattern provided by manifold 26, this uniform radial pumping provides uniform gas flow across the wafer 15 at all pressures and, thus, uniform deposition even at very high chamber pressures such as 200 torr and above.

Also, the manifold 26 is usable as an electrode for a uniform glow discharge plasma at unusually high pressures, which enables both the very high deposition rate and the effective purge flow.

C. Relevance of Certain Key Features to Multiple Process Capability

The key features of the reactor 10 include the following: (1) a wide range of operating pressures and, specifically, a high pressure regime; (2) temperature uniformity of the susceptor/wafer; (3) uniform flow distribution; (4) variable close spacing between the electrodes (inlet gas manifold 92 and susceptor 16) with parallelism; and (5) temperature control of internal/external gas inlet manifold surfaces.

The above features impart a wide range of processing capability to the reactor 10. Typically, at least several of these features are very important to each type of processing for which the present reactor has been used. Specifically, for self-cleaning the wide range of available operating pressures and the variable close spacing of the electrodes (inlet manifold 92 and susceptor 16) with parallelism are two of the more important features.

II. Oxide Deposition and Multiple Step In-Situ Planarization Process

The processing steps and multiple step processing sequences described here were performed in the reactor 10. The ability to perform multiple step processing using temperature sensitive gases such as ozone and TEOS and different steps such as CVD, PECVD, etching, and self-cleaning in-situ qualifies the reactor 10 as being uniquely preferred. However, the process disclosure here will permit those of usual skill in the art to practice the process sequences in other reactors, including single process, dedicated reactors.

A. Ozone TEOS Thermal CVD of Conformal SiO$_2$

The ozone TEOS-based oxide deposition is based in part upon the discovery that improved highly conformal (~100%) silicon dioxide-based coatings are formed by the thermal chemical vapor deposition of the reactants TEOS and ozone at relatively low temperatures, using radiant heating to provide a wafer temperature of about 200° C.–500° C., and high pressures of 10–200 torr and preferably about 40–120 torr. The ozone lowers the activation energy of the reaction kinetics and forms silicon dioxide with the TEOS at the relatively low temperatures of about 200° C. to 500° C.

A commercially available high pressure, corona discharge ozone generator is used to supply a mixture of (4–8) weight percent ozone (O$_3$) in oxygen to the gas distributor. Also, helium carrier gas is bubbled through liquid tetraethylorthosilicate (TEOS) to vaporize the TEOS and supply the diluted gaseous TEOS in the He carrier to the gas distributor with the ozone and TEOS gas mixture. The highly conformal silicon dioxide coating fills in the voids, cusps and other topographical irregularities and thereby provide a substantially planar surface.

In one exemplary embodiment, the ozone is applied at a flow rate of 2 to 3 slm, the helium carrier gas flow rate is 50 sccm to 1.5 slm, the chamber pressure is 40 to 120 torr and the wafer temperature is 375° C.±20° C., thereby providing a highly conformal undoped silicon dioxide coating at a deposition rate of 3,000 Angstroms/min.

Using the reactor 10, the presently contemplated useful flow rate range of the helium gas (the carrier for TEOS) is about 100 sccm to 5 slm (sccm=standard cubic centimeter per minute; slm=standard liters per minute). The ozone, O$_3$, flow is provided by the composition of 4 to 8 weight percent ozone in oxygen flowing at a rate of about 100 sccm to 10 slm. The total gas flow rate, not including the purge gases, typically can be within the range 200 sccm to 15 slm.

The gas distribution manifold (gas distributor 26) of the reactor 10 is controlled by de-ionized water of temperature 20°–50° C. circulating in passages therein to maintain the internal surface of the gas distributor 26 within the narrow range of about 35° C.–75° C., i.e., at a temperature of less than about 75° C. to prevent decomposition of the TEOS and reaction between the TEOS and ozone and above 35° C. to prevent condensation of the TEOS inside the gas distributor.

The distance from the temperature-controlled gas distributor 92 to the substrate 15 is preferably approximately one centimeter or less. This distance of one centimeter or less confines the plasma or gaseous reactants between the gas distribution 26 and the wafer 15. This increases the reaction efficiency, and increases the rate of the reaction (deposition) and helps to prevent deposition everywhere except on the wafer.

As described above, the ozone TEOS thermal CVD process uses unusually high deposition chamber pressures: pressures of preferably at least ≧10 torr and of about 20–200 torr are utilized. Even the lower portion of this range is over 20 times greater than the total pressure normally utilized in processes utilizing TEOS. The high pressure increases the density of available reactive species and, thus, provides a high deposition rate.

Furthermore, the use of high pressure enables an effective purge. The high purge flow rate improves the ability to remove waste gases, entrained particulates, etc., without unwanted deposition on the chamber surfaces. The above-described bottom purge flow sweeps radially outwardly across the bottom side of the susceptor wafer. The bottom flow is joined by an upper purge flow that is directed downwardly at the wafer's periphery. The combined streams flow radially outwardly from the periphery of the wafer, and cause the deposition gas to flow radially uniformly outwardly, then through the exhaust system of the chamber at very high flow rates. For example, useful top purge gas flow rate (preferably nitrogen) may be from 1 slm to 10 slm and the bottom purge gas flow rate (again, nitrogen) may be 1 slm to 20 slm. These high pressure, high flow rate top and bottom flows purge unwanted gases and particulates everywhere without disrupting the uniform deposition gas distribution at the top of the wafer.

The above-described gas flow, chamber pressure, and resulting chamber temperature have provided a silicon dioxide deposition rate of about 500 Angstroms/min. to 4,000 Angstroms/min.

While useful deposition rates of 500 and 400 Angstroms/min. have been achieved at corresponding temperatures of 200° C. and 500° C., the deposition rate peaks at about 375° C.±20° C. The decreased deposition above and below the peak is a consequence of unfavorable reaction kinetics at the surface of the substrate. Fortuitously, the peak temperature is also close to the maximum processing temperature of about 400° C. for aluminum-containing multiple conductor structures. Above ~400° C., hillocks form in aluminum. Above ~500° C., aluminum softens.

Using an (ozone and oxygen):helium flow rate ratio of 2:1 (2 slm of 8 wt. percent ozone in oxygen: 1 slm He carrier and TEOS) the deposition rate saturates at 3,000 Angstroms/min. at a chamber pressure of 80 torr, and wafer surface temperature of 375° C. (using a TEOS temperature of 35° C.), with very little increase at higher pressures. Decreasing the temperature to 200°–375° C. at 80 torr decreases the deposition rate to 1,000–3,000 Angstroms/min., respectively. At 20 torr, temperatures of 200°–375° C. provide a deposition rate of 500–1000 Angstroms/min. Above pressures of about 120 torr, gas phase reactions increase particulates. This can be controlled by decreasing the wafer temperature or increasing the diluent flow rate, but these steps decrease the deposition rate.

Furthermore, this high conformality coverage is provided using undoped oxide coatings. Conventional processes use reflowing to smooth the deposited oxide and incorporate phosphorus or boron doping (phosphosilicate glass, PSG, borosilicate glass, BSG, and borophosphosilicate glass, BPSG) to lower the reflow temperature. Our thermal CVD process eliminates the need for reflowing and, thus, the use of PSG, BSG and BPSG and associated problems such as aluminum corrosion. However, if desired, in our thermal CVD process, the conformal oxide could be doped to a low level of, e.g., 1 weight percent to 10 weight percent of phosphorus and/or boron by incorporating reactants such as TMP (tetramethylphosphite) and/or TMB (tetramethylborate). The low concentration doping level would provide sufficient reflow characteristics.

B. Plasma-Enhanced TEOS CVD of $SiO_2$

The PECVD oxide deposition process uses a plasma formed from TEOS, oxygen, and a carrier gas with or without a diluent such as helium. This process uses a deposition chamber pressure of from about 1 torr to about 50 torr; an oxygen flow rate of from about 100 sccm to 1,000 sccm, an inert carrier gas (helium) flow rate of from 100 to 1,500 sccm, a total gas flow rate (not including the purge gases) of 200 sccm to 2.5 liters per minute, and RF power to the ~6 in. diameter gas distributor cathode of about 200–400 watts. Power density at the gas distributor/cathode 26 is about 1 watt/cm$^2$ based on calculations for a quasi-parallel plate configuration. Radiant energy is directed to the susceptor from below by the annular array of vertical lamps to generate a deposition plasma and heat the wafer surface to a temperature of 300° to 500° C. Top (nitrogen plus helium mixture) and bottom (nitrogen only) purge gas flow rates of 1 to 15 slm and 1 to 20 slm, respectively, are used with respective preferred top and bottom purge gas flow rates of 2.5 slm and 10 slm. These parameters provide $SiO_2$ deposition rates of about 5,000 Angstroms/min. to 10,000 Angstroms/min. Typically, the separation between the electrodes 92 (the gas distribution plate) and 16 (the susceptor) is within the approximate range $0.4 \text{ cm} \leq d \leq 1$ cm.

Useful operating parameters for the PECVD oxide deposition step for a 6 in. wafer include 600 sccm oxygen, 900 sccm helium, 16,000 sccm total flow (including purge; 1,500 sccm excluding the purge), 10±2 torr pressure and 375° C.±20° C. wafer temperature. The parameters provide $SiO_2$ deposition rates of about 8,500 Angstroms/min. for a gas distributor-to-wafer surface distance, d≃0.4 cm.

Quite obviously, the above-described high pressure, PECVD TEOS process for depositing oxide, which is based upon TEOS gas chemistry and has similar but different chamber requirements as the ozone TEOS process for depositing conformal dioxide, makes the use of the versatile chamber 10 not only possible, but preferable, because chamber 10 can perform both processes.

The present PECVD TEOS oxide deposition process provides improving deposition rate, cracking resistance, physical and electrical properties in a CVD-deposited silicon dioxide layer. The present invention also provides an improved method for depositing silicon dioxide whereby improved step coverage and lower stress and higher cracking resistance of the deposited layer are obtained.

C. Two-Step Planarization Process

The process is an improvement of conventional methods for planarizing silicon dioxides such as, for example, conventional methods using spin-on glass and polyimide deposition with etch-back.

This planarization sequence comprises first, the use of the above-described ozone TEOS oxide deposition process to substantially planarize a dielectric layer, followed by, secondly, the use of an isotropic wet or dry etch, preferably at a high etch rate, to complete the planarization process. The combination of the above-described ozone TEOS conformal oxide deposition in conjunction with various wet or dry isotropic etch steps provides an unexpectedly conformal, planarized dielectric layer which serves well in the small geometry, multi-level metallization structures that are currently being developed and will be developed in the future. Described below is a presently preferred dry isotropic etch process which can be performed in-situ, in the same, multi-step chamber 10.

D. Three-Step Planarization Process

This process comprises, first, forming a layer of silicon dioxide, preferably at a high deposition rate; secondly using the above-described ozone TEOS conformal oxide deposition to form a highly conformal oxide coating; then, thirdly, using an isotropic preferably high rate etch sequence to quickly complete the planarization process.

The above-described PECVD TEOS process is a preferred process for the first, high rate oxide deposition step.

A preferred third step, i.e., the preferred high rate isotropic etch process, comprises exposing the existing silicon dioxide surface to a plasma formed from gas selected from $NF_3$, $CF_4$, $C_2F_6$, $C_4F_8$, $CHF_3$ and/or other fluorinate gases in a doping gas such as helium to stabilize the plasma, in a chamber at a temperature in the range of about 100° C. to 500° C. and preferably 200° C. to 400° C. (Helium and/or oxygen can be incorporated to form gases with the carbon.) The total gas chamber pressure for these gases will usefully be in the range of about 200 mt to 20 torr. The preferred range is 500 mt to 10 torr. The total gas flow rate of the plasma will be determinable by those skilled in the art. However, an operable range of 20 sccm to 3.5 slm has been found useful for the apparatus disclosed in the referenced multiple process CVD/PECVD reactor. The preferred total gas flow rate is from about 170 sccm to 1.25 slm. The useful range for the $NF_3$ (or $C_2F_6$) gas flow is from about 10 sccm to 500 sccm, with the preferred range being from about 70 to 200 sccm. The individual flow rate of the doping gas, usually helium, will be from about 10 sccm to 3.5 slm and, preferably, 100 sccm to 1 slm. RF power density of about 0.5−1 watts/$cm^2$ was used, along with radiant power from the lamp module to provide the substrate temperature of <500° C. and the preferred temperature of 200° C.–400° C. An electrode spacing of about 0.4 in. is used.

At the relatively high temperatures used, it has been found that rapid accurate isotropic etching of the silicon dioxide is accomplished. Specifically, etching rates of from 500 Angstroms per minute to 1 micron per minute are obtained wherein the etching is isotropically performed and smooth.

While this isotropic etch process is also useful generally, for example, for forming metal contacts, it is particularly useful for providing profile control of $SiO_2$ step-coverage layers, as described above. In particular, this uniform high rate isotropic etch has the advantage of additionally planarizing the substantially planarized contour which results from the $SiO_2$ deposition.

This high rate isotropic etch step was done in-situ in the same reactor used for the two above-described silicon dioxide deposition steps. As a consequence, this preferred sequence provides an integrated in-situ three-step process for forming a planarized silicon dioxide layer even over non-planar layers incorporating small geometry steps, trenches, etc. In combination with the TEOS and ozone-based thermal CVD conformal oxide deposition step, the use of the high rate PECVD oxide deposition step and the high rate etching step, the ability to use the same chamber for all three steps provides a fast, high throughput planarization process which is also less susceptible to contamination and wafer damage and other problems which result when a wafer is handled repeatedly and switched from one chamber to another.

In addition, while the above-described three-step in-situ process is a presently preferred embodiment of our planarization process for silicon dioxide, the ozone TEOS thermal CVD step (second step) can be used in combination with other initial dielectric coatings and other isotropic etch steps. For example, the ozone thermal CVD second step can be used to deposit a highly conformal silicon dioxide coating on silicon oxide or silicon nitride or silicon oxynitride or other dielectric layers formed by CVD or by other methods, and the resulting substantially planarized layer can be etched to a planar topography using other, preferably high rate, dry (e.g., plasma) or wet chemical isotropic etch methods. Also, the three steps of the process can be used in a different order and/or repeated to give the desired result.

III. Chamber System Self-Cleaning

The present invention encompasses a localized chamber self-etch and a wide area chamber self-etch. These two divergent in-situ etch steps or sequences use the wide pressure capability and the variable close electrode spacing of the present reactor in combination with the gas chemistry described here. The local etch is used to clean the RF electrodes, i.e., the susceptor 16 and the inlet gas manifold face plate 92. The extended or wide area etch cleans the entire chamber including the downstream vacuum system.

Such diverse capability is advantageous for any reactor. It is particularly advantageous for the reactor 10, which, as mentioned, is adapted for processing very small geometry devices, which are susceptible to damage caused by particulates. Although the reactor 10 operates at relatively higher pressure than conventional reactors, it nonetheless may create long-lived species which deposit in the vacuum exhaust system and in downstream vacuum system components to and including the throttle valve. Thus, while the operation of the present reactor 10 is cleaner than conventional reactors and while cleaning can be done less frequently, the ability to clean both the vacuum system and the reactor chamber rapidly and frequently, if necessary, is very desirable in preventing particulate contamination and in ensuring long-term proper operation of components such as the throttle valve.

The localized self-cleaning step or process uses a fluorocarbon gas etch chemistry, relatively high pressure and relatively close spacing between the electrodes 16 and 92 (the spacing is similar to that used for deposition), to provide the desired high etch rate and stable plasma for fast local cleaning of the electrodes 16 and 92 and nearby chamber components.

The extended or wide area self-cleaning process uses a relatively lower pressure, and relatively larger electrode spacing and fluorinated gas chemistry for etching the entire chamber as well as the vacuum system components at a high rate. These components include, but are not limited to, in addition to the susceptor 16 and manifold 92 and related components, the window 70, the baffle flow control plate 114 and the exhaust holes 116 therein, the vacuum exhaust channel 118 and in general the components along the exhaust path 105 and 109 at least to and including the associated throttle valve (not shown).

Deposits build up faster locally, e.g., on the gas manifold 92, than at the more distant areas of the chamber and downstream. Thus, typically, the local etch step will be used alone at least several times before it is necessary to use the wide area etch step to clean the entire chamber and downstream. For example, after a number of cycles of deposition and local etch, when the total oxide deposition has reached about 25 microns, the extended etch step is also used. This overall process sequence can be characterized as deposition (or deposition with interspersed etching), local etch, . . . deposition, local etch and then deposition, local etch, extended area etch after the total deposition is about 25 microns.

In a presently preferred embodiment for a quasi-parallel configuration for a five inch wafer, the first relatively high pressure, close electrode spacing, high rate fluorocarbon gas etch step comprises communicating a fluorocarbon and oxygen etching gas mixture into the reactor chamber at a pressure within the range 2–15 torr, using RF power of about 250–650 watts to provide an RF power density within the range of about 1–3 watts/$cm^2$ at a frequency of 13.56 megahertz, and using an electrode spacing of about 160 mils, to clean the chamber locally. In this local etch step, we have found that using a mixture of $C_2F_6$ and $O_2$ at a $C_2F_6:O_2$ flow ratio of about 1:1 provides optimum results in the present reactor. In particular, flow rates of about 100 sccm:100 sccm are used.

In a presently preferred embodiment also for the quasi-parallel five inch wafer configuration, the second, relatively lower pressure, relatively larger spacing, fluorinated gas, extended area etch step comprises communicating NF$_3$ into the reactor chamber at a flow rate within the range of about 50-150 sccm at a pressure of about 500 millitorr to one torr, using an electrode spacing of about 400 mils, and 13.56 MHz RF power of about 125-500 watts to provide an RF power density of about 0.5-2 watts/cm$^2$, to clean both the entire chamber and the downstream components. It should be noted that the lower pressure and the greater electrode spacing facilitates extending or spreading the cleaning plasma throughout the chamber and downstream.

Parameters such as power and flow for the five inch wafer configuration will be readily scaled upward or downward for larger or smaller wafers. Also, we anticipate that flow rates and ratios other than those given here can be used in this and other reactors.

A presently preferred optimum embodiment of the local etch process using the reactor 10 comprises communicating C$_2$F$_6$ and O$_2$ into the chamber at flow rates of 100 sccm/min each using a chamber pressure of 10 torr, RF power of 600 watts to provide a power density of 2.4 watts/cm$^2$, and an electrode spacing of about 160 mils. This provides local etch rates of about one micron per minute.

A presently preferred optimum embodiment of the extended etch process using the reactor 10 comprises flowing NF$_3$ into the chamber at a flow rate of 100 sccm using a chamber pressure of 600 millitorr and RF power of about 300 watts to provide a power density of about 1.2 watts/cm$^2$, and an electrode spacing of about 400 mils (one centimeter). Although it is very difficult to measure the etch rates downstream in the vacuum system during the second step, experience indicates that this step provides etch rates of about 0.7-0.8 microns per minute.

Perhaps the best indication of the effectiveness of these two processes is given by the time required for cleaning. Thus, for example, after using the above-described PECVD or pyrolytic processes to deposit silicon dioxide films of total thickness within the range one to two microns, the local self-cleaning step cleans the reactor locally in about 1-1.5 minutes. Once the total oxide deposition thickness of 25 microns is reached, the extended area self-cleaning step cleans the overall reactor and downstream components in about four minutes.

The following table graphically illustrates the sequential use of these self-cleaning steps to maintain a clean reactor chamber. It will be appreciated that the thicknesses associated with the individual deposition steps and the resulting required etch times are given solely by way of example.

TABLE

| Process Step | Thickness/Etch Time |
| --- | --- |
| Deposition | 1-2 microns |
| Local Etch | 1-1.5 minutes |
| Deposition | 1-2 microns |
| Local Etch | 1-1.5 minutes |
| . | |
| . | |
| . | |
| Deposition | 1-2 microns, 25 micron total |
| Local Etch | 1-1.5 minutes |
| Extended Area Etch | 4 minutes |

While this invention has been described above in connection with various preferred and alternative embodiments, it is understood that persons of skill in the art can make numerous modifications without departing from the scope of the invention as claimed in the following claims.

What is claimed is:

1. A process for self-cleaning a reactor chamber, comprising:

providing a gas inlet manifold electrode and an adjacent, parallel wafer support electrode having adjustable spacing therebetween, communicating into the chamber via the gas inlet manifold electrode a gas mixture comprising fluorocarbon gas while applying RF power between the gas inlet manifold electrode and the wafer support electrode while maintaining the chamber at a sufficiently high pressure within the range of about 2-15 torr, for forming an etching plasma of the gas mixture with the gas inlet manifold electrode and wafer support electrode at a first spacing, selected for locally etching deposits from at least the gas inlet manifold electrode and the wafer support electrode, and communicating into the chamber via the gas inlet manifold electrode a fluorinated gas while applying RF power between the gas inlet manifold electrode and the wafer support electrode for forming an etching plasma of the fluorinated gas and while maintaining the chamber at a pressure within the range of about one-half torr to one torr and the manifold electrode and the wafer support electrode at a second selected spacing greater than the first spacing for etching substantially throughout the chamber.

2. The self-cleaning process of claim 1, wherein the gas mixture comprises fluorocarbon gas doped with oxygen.

3. A method of using an RF powered reactor chamber having a gas inlet manifold electrode, and an exhaust outlet system, comprising:

providing a wafer support electrode for a semiconductor wafer and a gas inlet manifold electrode parallel to the wafer support electrode and having adjustable spacing therebetween;

as a first process step, depositing at least one layer of silicon-containing material on a wafer positioned on the wafer support electrode;

as a second process step, spacing apart the gas inlet manifold electrode and the wafer support electrode a first distance and communicating into the chamber via the gas inlet manifold a gas mixture comprising a fluorocarbon gas doped with oxygen while applying RF power between the gas inlet manifold electrode and the wafer support electrode and maintaining the chamber at a first pressure within the range of about 2-15 torr for forming an etching plasma to locally etch deposits from the gas inlet manifold electrode and the wafer support electrode;

as a third process step, spacing apart the gas inlet manifold electrode and the wafer support electrode a second distance said second distance greater than said first distance and communicating into the chamber via the gas inlet manifold electrode a fluorinated gas while applying RF power between the gas inlet manifold electrode and wafer support electrode and maintaining the chamber at a second pressure, less than the first pressure and selected for forming an etching plasma substantially throughout the chamber.

4. The method of claim 3, further comprising repeating a cycle comprising the first, deposition step and the second, local etch step.

5. A method of using an RF powered reactor chamber having a gas inlet manifold electrode, and an exhaust system, comprising:

providing a wafer support electrode for supporting thereon a workpiece including a semiconductor wafer, a gas inlet manifold electrode parallel to the wafer supporting electrode, the wafer supporting electrode and gas inlet manifold electrode having adjustable spacing therebetween;

as a first process step, depositing at least one layer of silicon-containing material on a wafer positioned on the wafer supporting electrode;

as a second process step, spacing apart the gas inlet manifold electrode and the wafer supporting electrode a first distance and communicating into the chamber via the gas inlet manifold electrode a gas mixture comprising a fluorocarbon gas doped with oxygen while applying RF power between the gas inlet manifold electrode and the wafer supporting electrode and maintaining the chamber at a first pressure within the range of about 2-15 torr for forming an etching plasma to locally etch deposits from the gas inlet manifold electrode and the wafer supporting electrode;

repeating the cycle comprising the first, deposition step and the second, local etch step; and after at least several said cycles, cleaning the chamber by spacing apart the gas inlet manifold electrode and the wafer supporting electrode a second distance greater than said first distance, communicating into the chamber via the gas inlet manifold electrode a fluorinated gas while applying RF power between the gas inlet manifold electrode and the wafer supporting electrode for forming an etching plasma of the gas and maintaining the chamber at a second pressure lower than the first pressure, said second pressure selected for extending the etching plasma substantially throughout the chamber.

6. The method of claims 1, 3 or 5, wherein during the local etch step, the gas is a mixture of $C_2F_6$ and oxygen, said spacing is about 0.4 cm, and RF power is applied at a power density within the range 1-3 watts/cm$^2$.

7. The method of claim 6, wherein the $C_2F_6$ and oxygen are applied at the flow rate ratio of about 1:1, the pressure is about 10 torr and the RF power density is about 2.4 watts/cm$^2$.

8. The method of claims 1, 3 or 5, wherein during the local etch step, the gas is a mixture of $C_2F_6$ and oxygen, said spacing is about 0.4 cm, and RF power is applied at a power density within the range 1-3 watts/cm$^2$, and wherein during the extended area chamber etch step, the fluorinated gas if $NF_3$, said spacing is about 1 cm and RF power is applied at a power density of about 0.5 to 2 watts/cm$^2$.

9. The method of claim 8, wherein during the local etch step $C_2F_6$ and oxygen are applied at a flow rate ratio of about 1:1 and the pressure is about 10 torr and wherein during the extended area chamber etch step, the chamber pressure is about 600 millitorr.

10. A process for in-situ self-cleaning of the internal chamber components including walls and electrodes of an RF powered reactor chamber, comprising:

providing a chemical vapor deposition reactor chamber comprising a wafer support adapted for use as an RF electrode and a gas inlet manifold adapted for use as an RF electrode, the gas inlet manifold electrode being adjacent to and oriented parallel to the wafer support electrode, to thereby apply RF power between the gas inlet manifold electrode and the wafer support electrode, the spacing between the gas inlet manifold electrode and the wafer support electrode being variable;

as a local, gas inlet manifold electrode and wafer support electrode etch step, communicating into the chamber via the gas inlet manifold electrode a gas comprising $C_2F_6$ and oxygen while applying RF power between the gas inlet manifold electrode and the wafer support electrode at a density of approximately 1 to 3 watts/cm$^2$ and while maintaining the chamber at a pressure within the flange of about 2 to 15 torr and the manifold-to-wafer support electrode spacing at a first distance, to thereby etch deposits from at least the gas inlet manifold electrode and the wafer support electrode and adjacent chamber components; and as an extended area, chamber etch step, communicating into the chamber via the gas inlet manifold electrode $NF_3$ while applying RF power between the gas inlet manifold electrode and the wafer support electrode at a density of approximately 0.5 to 2 watts/cm$^2$ and while maintaining the chamber at a pressure within the range of about 0.5 to 1 torr and the manifold-to-wafer support spacing at a second distance greater than the first distance to thereby etch the internal chamber components including the walls thereof.

11. The process of claim 10, wherein during the local etch step the gas inlet manifold electrode and wafer support electrode are spaced apart approximately 0.4 cm.

12. The process of claim 10, wherein during the extended area etch step the gas inlet manifold electrode and wafer support electrode are spaced apart approximately 1 cm.

13. The process of claim 10, wherein during the local etch step the gas inlet manifold electrode and wafer support electrode are spaced apart approximately 0.4 cm and during the extended area etch step the gas inlet manifold electrode and wafer support electrode are spaced apart approximately 1 cm.

14. The process of claims 10, 11, 12 or 13, wherein during the local etch step $C_2F_6$ and $O_2$ are inlet at a flow rate ratio of about 1:1, the chamber pressure is approximately 10 torr and the RF power density is about 2.4 watts/cm$^2$.

15. The process of claim 14, wherein during the extended area etch step, the chamber pressure is approximately 600 millitorr, and the RF power density is approximately 1.2 watts/cm$^2$.

16. The process of claims 10, 11, 12 or 13, wherein during the local etch step the chamber pressure is approximately 10 torr and the RF power density is about 2.4 watts/cm$^2$ and during the extended area etch step the chamber pressure is about 0.6 torr and the RF power density is about 1.2 watts/cm$^2$.

* * * * *